United States Patent [19]
Jun et al.

[11] Patent Number: 5,393,373
[45] Date of Patent: Feb. 28, 1995

[54] METHODS OF PATTERNING AND MANUFACTURING SEMICONDUCTOR DEVICES

[75] Inventors: Young K. Jun; Sa K. Ra; Dong W. Kim; Hyun H. Seo, all of Seoul; Sung C. Kim, Kyungki-do; Jun K. Kim, Seoul, all of Rep. of Korea

[73] Assignee: Goldstar Electron Co., Ltd., Cheongju, Rep. of Korea

[21] Appl. No.: 135,197

[22] Filed: Oct. 12, 1993

Related U.S. Application Data

[62] Division of Ser. No. 911,594, Jul. 10, 1992, Pat. No. 5,256,587.

[30] Foreign Application Priority Data

Jul. 11, 1991 [KR] Rep. of Korea .................. 11803/91
Aug. 21, 1991 [KR] Rep. of Korea .................. 14388/91

[51] Int. Cl.⁶ ...................... H01L 21/306; B44C 1/22
[52] U.S. Cl. ...................... 156/630; 156/633; 156/643; 156/657; 156/659.1; 156/662; 437/228; 437/233; 437/52; 437/72
[58] Field of Search ............ 156/630, 633, 643, 652, 156/657, 659.1, 661.1, 662, 648; 437/52, 61, 62, 63, 64, 65, 67, 72, 78, 79, 228, 229, 233, 919

[56] References Cited

U.S. PATENT DOCUMENTS

| | | | |
|---|---|---|---|
| 4,407,695 | 10/1983 | Deckman et al. | 156/643 |
| 4,545,852 | 10/1985 | Barton | 156/643 |
| 4,664,748 | 5/1987 | Ueno et al. | 156/659.1 |
| 5,023,204 | 6/1991 | Adachi et al. | 437/228 |
| 5,134,086 | 7/1992 | Ahn | 437/52 |
| 5,158,905 | 10/1992 | Ahn | 437/52 |

OTHER PUBLICATIONS

Electrical Characterization of Textured Interpoly Capacitors for Advanced Stacked Drams by: Pierre C. Fazan and Akram Ditali; IEDM 1990, pp. 27.5.1–27.5.4.

Rugged Surface Poly-si Electrode and Low Temperature Deposited Si₃N₄ for 64MBIT and Beyong STC Dram Cell by: M. Yoshimaru, J. Miyano, N. Inoue, A. Sakamoto, S. You, H. Tamura and M. Ino; IEDM 1990, pp. 27.4.1–27.4.4.

A capacitor-Over-Bit-Line (COB) Cell with a Hemispherical-Grain Storage Node for 64Mb DRAMs by: M. Sakao, N. Kasai, T. Ishijima, E. Ikawa, H. Watanabe, K. Terada and T. Kikkawa; IEDM 1990; pp. 27.3.1–27.3.4.

*Primary Examiner*—William Powell
*Attorney, Agent, or Firm*—Alan R. Loudermilk

[57] ABSTRACT

Methods of hyperfine patterning and manufacturing semiconductor devices. Steps in accordance with the present invention include coating a hemisphere particle layer having hills and valleys on a layer to be etched, the hemisphere particle layer having an etch selectivity higher than that of the first layer, filling the valleys of the hemisphere particle layer with a second layer having an etch selectivity higher than that of the hemisphere particle layer, and etching back the hills of the hemisphere particle layer to expose the first layer by using the second layer as a mask, and etching the first layer. By virtue of the hemisphere particle layer having alternating hills and valleys, it is possible to accomplish a hyperfine patterning of about 0.1 μm. Since the mean size and the density of hills and valleys of the hemisphere layer can be controlled, the pattern size also can be controlled. Where the present invention is applied to capacitors of semiconductor memory elements, the capacitor node surface area can be increased, depending on the etched back depth of a polysilicon layer.

15 Claims, 18 Drawing Sheets

F I G . 2a
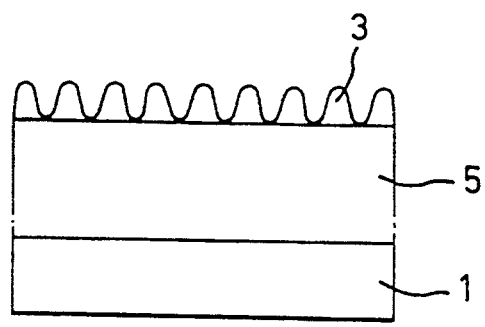
F I G . 2b
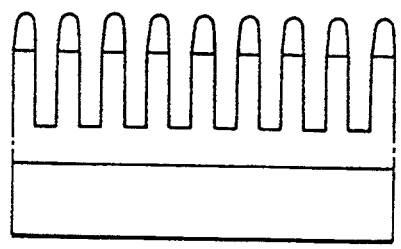

F I G. 11d
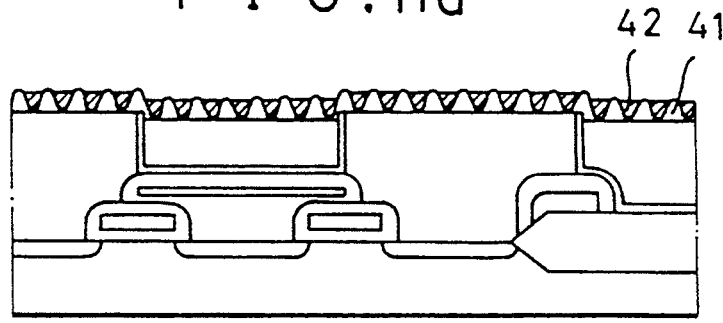
F I G. 11e
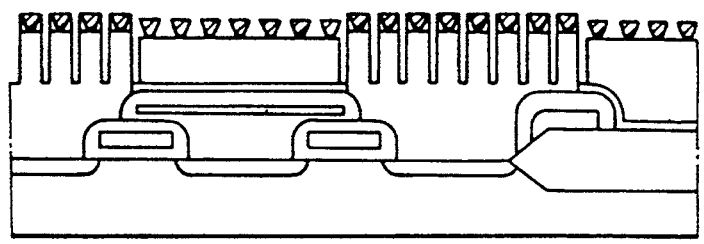
F I G. 11f
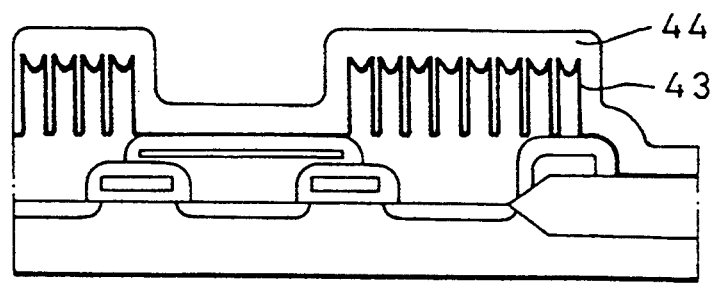

F I G. 12a
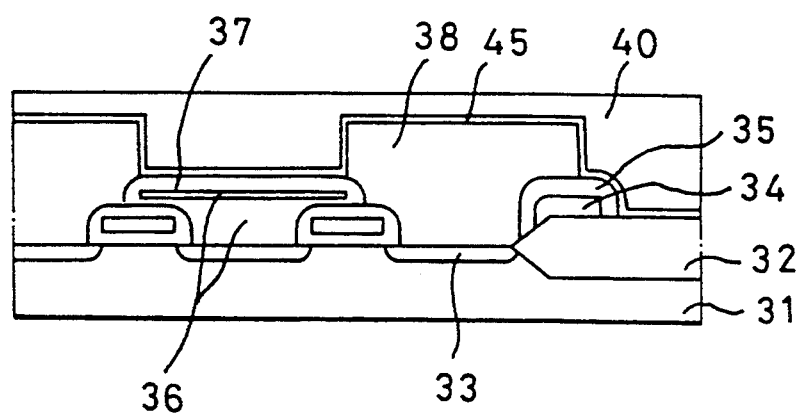
F I G. 12b
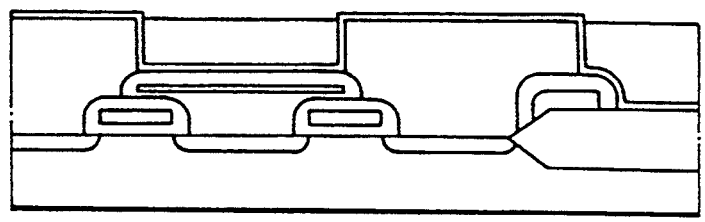
F I G. 12c
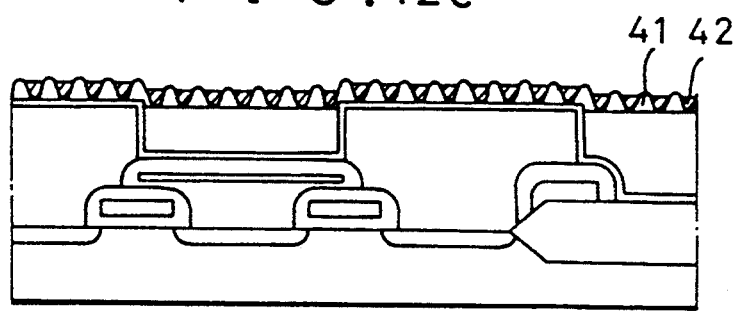

F I G. 12d
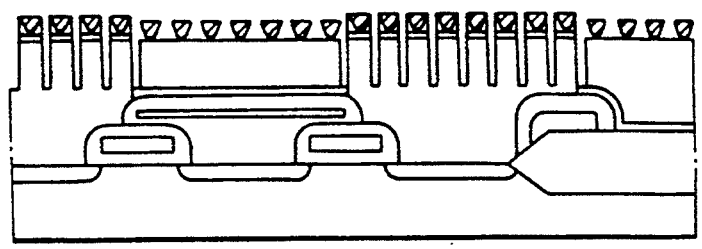
F I G. 12e
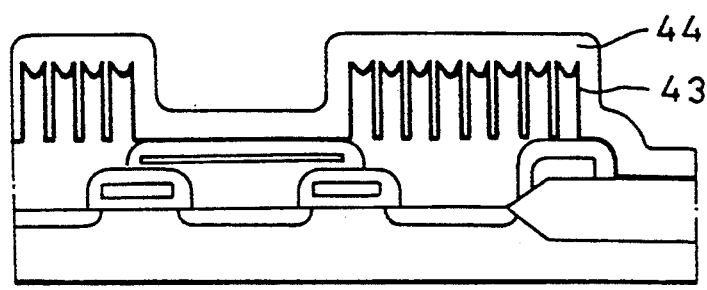

METHODS OF PATTERNING AND MANUFACTURING SEMICONDUCTOR DEVICES

This is a divisional of application Ser. No. 07/911,594, filed on Jul. 10, 1992, now U.S. Pat. No. 5,256,587.

BACKGROUND OF THE INVENTION

1. Field of the Invention

The present invention relates to a method of manufacturing semiconductor devices, and more particularly to a hyperfine patterning method useful in the manufacture of semiconductor devices.

2. Description of the Prior Art

Presently, the development of patterning technologies is strongly proceeding, according to the trend of high integration of semiconductor devices. Typical of present patterning technology are lithographic techniques. Lithographic technology is used in the process of determining the structure of a semiconductor device to be manufactured. It is the technology of accurately transmitting the pattern information of semiconductor devices to the surface of a wafer. That is, lithographic technology comprises forming a pattern on a resist coated on the surface of a wafer, by exposing the resist to light according to pattern data, and then performing a resist process such as development, and performing an etching or ion injection process by using the resist pattern as a mask.

However, such lithographic technology requires various equipment, in particular light exposing equipment, which limits the pattern size of resists.

SUMMARY OF THE INVENTION

Therefore, it is an object of the present invention to overcome problems encountered in the prior art and provide a hyperfine patterning method for semiconductor devices wherein hemisphere particles are used as a mask pattern.

Another object of the present invention is to provide a hyperfine patterning method for semiconductor devices wherein valleys formed among hemisphere particles are filled with a material having an etching selectivity higher than that of the hemisphere particles, so as to use the material as a mask pattern.

A further object of the invention is to provide a method for manufacturing semiconductor memory elements of high capacity by utilizing a hyperfine patterning using hemisphere particles.

In one aspect, the present invention provides a hyperfine patterning method for a semiconductor device comprising the steps of: coating a hemisphere particle layer having hills and valleys on a first layer to be etched, the hemisphere particle layer having an etch selectivity higher than that of the first layer; filling the valleys of the hemisphere particle layer with a second layer having an etch selectivity higher than that of the hemisphere particle layer; and etching back the hills of the hemisphere particle layer to expose the first layer, by using the second layer as a mask, and subsequently etching back the first layer.

In another aspect, the present invention also provides a hyperfine patterning method for a semiconductor device comprising the steps of: coating a hemisphere particle layer having hills and valleys on a first layer to be etched, the hemisphere particle layer having an etch selectivity identical to that of the first layer; filling the valleys of the hemisphere particle layer with a second layer having an etch selectivity higher than that of the hemisphere particle layer; and continuously etching back the hills of the hemisphere particle layer and the first layer to a predetermined depth, by using the second layer as a mask.

In a further aspect, the present invention provides a hyperfine patterning method for a semiconductor device comprising the steps of: coating a hemisphere particle layer having hills and valleys on a first layer to be etched, the hemisphere particle layer having an etch selectivity higher than that of the first layer; and etching back the portions of the first layer beneath the valleys of the hemisphere particle layer, by using the hills of the hemisphere particle layer as a mask.

BRIEF DESCRIPTION OF THE DRAWINGS

Other objects and aspects of the invention will become apparent from the following description of embodiments with reference to the accompanying drawings in which:

FIGS. 2a and 2b are schematic sectional views for explaining a hyperfine patterning method for semiconductor devices in accordance with a second embodiment of the present invention;

FIGS. 11a to 11f are schematic sectional views for explaining a method of providing isolation between adjacent capacitors in manufacturing capacitors of semiconductor devices, in accordance with the present invention;

FIGS. 12a to 12e are schematic sectional views for explaining another method of providing isolation between adjacent capacitors in manufacturing capacitors of semiconductor devices, in accordance with the present invention.

DETAILED DESCRIPTION OF THE PREFERRED EMBODIMENT

Figure 1A:
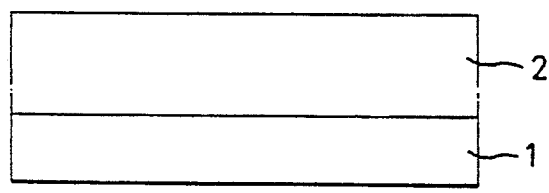
FIGS. 1a to 1d are schematic sectional views for explaining a hyperfine patterning method for semiconductor devices in accordance with an embodiment of the present invention.
Figure 1B:
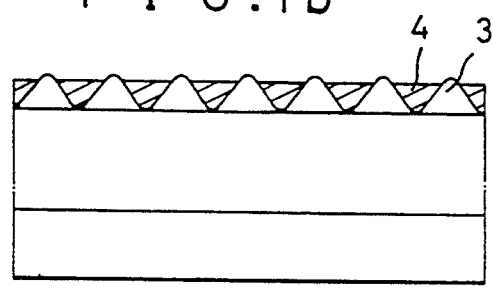

FIGS. 1a to 1d are schematic sectional views for explaining a hyperfine patterning method for semiconductor devices in accordance with an embodiment of the present invention. In accordance with the present invention, a semiconductor substrate 1 (FIG. 1a) having optional layer 2 to be etched is first coated with hemisphere layer 3, as shown in FIG. 1b. According to one embodiment of the present invention, hemisphere particle layer 3 is a polysilicon layer which is formed at a temperature of about 560° C. to about 600° C. and under a pressure of about 0.1 Torr to about 1.5 Torr in the case of $SiH_4$ gas, or at a temperature of about 570° C. to about 610° C. and under a pressure of about 0.1 Torr to about 1.5 Torr in the case of $Si_2H_6$ gas, by using a LPCVD process. As will be appreciated, the above temperature range is about the transition temperature at which the deposited polysilicon transitions from being deposited in an amorphous form to being deposited in a polycrystalline form. Formation of the polysilicon layer as described above results in a layer consisting of raised, rounded polysilicon features generally resembling "hemispheres," with characteristics of the hemispheres such as size, shape and pitch dependent upon the particular deposition conditions.

Figure 1C:
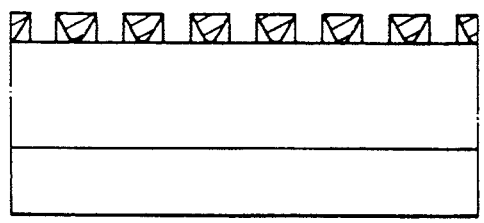

As shown in FIG. 1b, formed hemisphere particle layer 3 has alternating hills and valleys. On hemisphere particle layer 3, another optional layer 4 having an etching selectivity higher than those of both layer 2 and hemisphere particle layer 3 is coated to have a predetermined thickness. Layer 4 is then etched back such that the crest of each hill of hemisphere particle layer 3 is exposed, as shown in FIG. 1b. Accordingly, layer 4 partially remains only in valleys of hemisphere particle layer 3. Thereafter, the exposed hill portions of hemisphere particle layer 3 are etched back to expose layer 2 partially, by using remaining portions of layer 4 as a mask. As a result, a mask pattern is formed as shown in FIG. 1c.

Figure 1D:
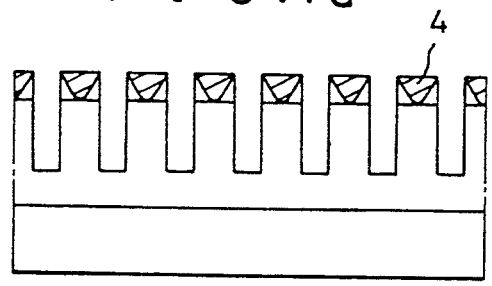

As the exposed portions of layer 2 are then etched back to a predetermined depth, by using a RIE (Reactive Ion Etching) process, layer 2 has a hyperfine pattern of about 0.1 μm defined by valley portions of hemisphere particle layer 3, as shown in FIG. 1d. After such desired pattern is obtained, the layer which was used as the mask is removed. Where layer 2 is of the same material as that of hemisphere particle layer 3, for example, it is a polysilicon layer, they can be simultaneously etched back.

On the other hand, FIGS. 2a and 2b are schematic sectional views for explaining a hyperfine patterning method for semiconductor devices in accordance with a second embodiment of the present invention. In this embodiment, the same reference numerals as those of the above-mentioned embodiment designate layers of the same materials, respectively. In accordance with this embodiment, semiconductor substrate 1 having optional layer 5 to be etched is first coated with hemisphere layer 3, as shown in FIG. 2a. According to this embodiment of the present invention, layer 5 is formed by using a material so that hemisphere particle layer 3 has an etching selectivity higher than that of layer 5. Hemisphere particle layer 3 is formed in the same manner as in the first embodiment, to have alternating hills and valleys.

The portions of layer 5 disposed beneath the valley portions of hemisphere particle layer 3 are then etched back, by using the hill portions of hemisphere particle layer 3 as a mask. As a result, layer 5 has a hyperfine pattern defined by hill portions of hemisphere particle layer 3, as shown in FIG. 2b. To accomplish the etching back of layer 5, the valley portions of hemisphere particle layer 3 should be exposed before the etching back. This exposure can be accomplished by etching back hemisphere particle layer 3 after coating or by controlling the coating time thereof.

Figure 3A:
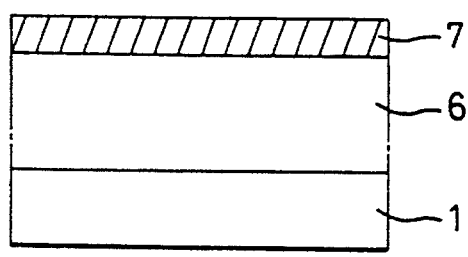
FIGS. 3a to 3d are schematic sectional views for explaining a hyperfine patterning method for semiconductor devices in accordance with a third embodiment of the present invention.
Figure 3B:
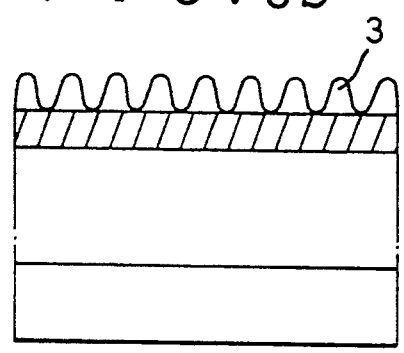

FIGS. 3a to 3d are schematic sectional views for explaining a hyperfine patterning method for semiconductor devices in accordance with a third embodiment of the present invention. In this embodiment, the same reference numerals as those of the above-mentioned embodiments designate layers of the same parts, respectively. In accordance with this embodiment, semiconductor substrate 1 having optional layer 6 to be etched is first coated with another optional layer 7, as shown in FIG. 3a. According to this embodiment of the present invention, layer 7 is formed by using a material having an etching selectivity higher than that of layer 6. Thereafter, hemisphere particle layer 3 which has an etching selectivity higher than that of layer 7 is coated on layer 7, as shown in FIG. 3b. Hemisphere particle layer 3 is formed in the same manner as in the above-mentioned embodiments, to have alternating hills and valleys.

Figure 3C:
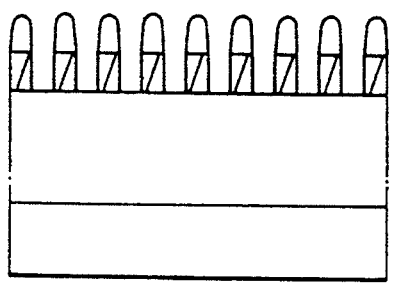

The portions of layer 7 disposed beneath the valley portions of hemisphere particle layer 3 are then etched back to expose layer 6 partially, by using the hill portions of hemisphere particle layer 3 as a mask, as shown in FIG. 3c.

Figure 3D:
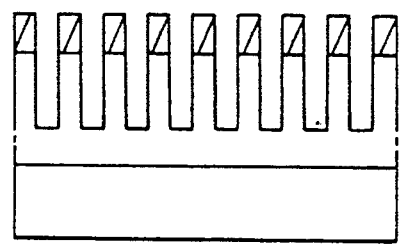

As the exposed portions of layer 6 are then etched back to a predetermined depth, by using the hill portions of hemisphere layer 3 as a mask, layer 6 has a hyperfine pattern defined by valley portions of hemisphere particle layer 3, as shown in FIG. 3d.

Where respective layers 2, 5 and 6 having hyperfine pattern according to the above-mentioned embodiments are applied to capacitors of semiconductor memory elements, it is possible to obtain high capacity of about 5 times that of a conventional capacitor.

Now, the present invention will be described with respect to an application involving the manufacture of capacitors.

FIGS. 4a to 4d are schematic sectional views for explaining a method of manufacturing capacitors of semiconductor devices in accordance with the first embodiment of the present invention.

Figure 4A:
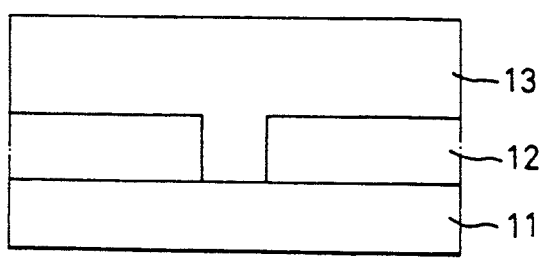
FIGS. 4a to 4d are schematic sectional views for explaining a method of manufacturing capacitors of semiconductor devices in accordance with the first embodiment of the present invention.
Figure 4B:
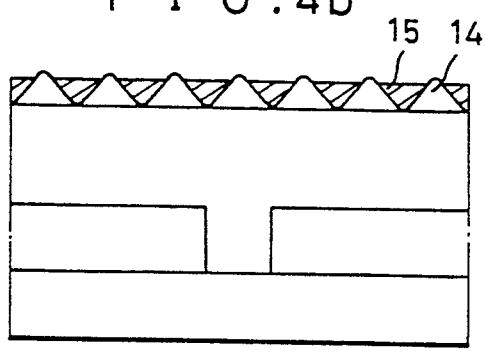

In this method, oxide layer 12 is first coated on semiconductor substrate 11 on which a transistor (not shown) has been previously formed. In oxide layer 12, capacitor node contacts are then formed. Thereafter, doped polysilicon layer 13 is coated on the overall surface of oxide layer 12, as shown in FIG. 4a. On polysilicon layer 13, hemisphere particle layer 14 of polysilicon is coated to have alternating hills and valleys, as shown in FIG. 4b. On hemisphere particle layer 14, planarizing insulation layer 15 of a material having an etching selectivity higher than that of polysilicon is coated. The material of planarizing insulation layer 15 may be SOG, polyamide, CVD oxide or CVD nitride. Layer 15 is then etched back such that the crest of each hill of hemisphere particle layer 14 is exposed. Accordingly, layer 15 partially remains only in valleys of hemisphere particle layer 14.

Figure 4C:
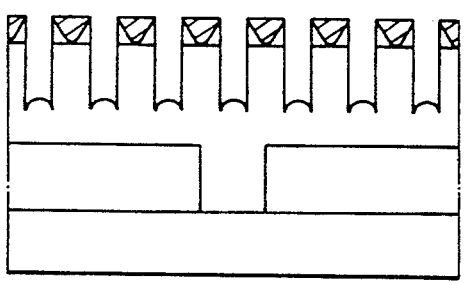

Thereafter, the exposed hill portions of hemisphere particle layer 14 are etched back by using remaining portions of layer 15 as a pattern mask. Polysilicon layer 13 is subsequently etched to a predetermined thickness, through the etched portions of hemisphere particle layer 14. As a result, polysilicon layer 13 has a plurality of protrusions thereon, as shown in FIG. 4c.

Figure 4D:
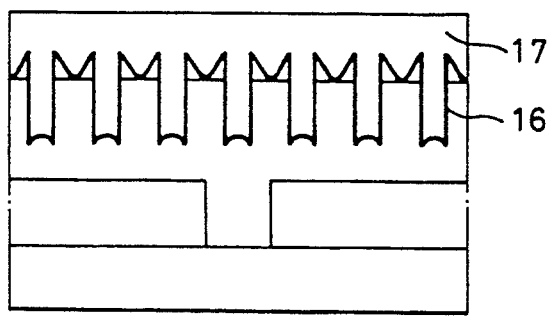

After the remaining portions of planarizing insulation layer 15 are removed, dielectric layer 16 and plate polysilicon layer 17 are coated in turn on the overall upper surface of polysilicon layer 13 to produce a capacitor, as shown in FIG. 4d.

In order to provide additional control of the pitch of hemisphere particle layer 14, that is the size of hills and the space between adjacent hills or adjacent valleys, in performing the step shown in FIG. 4b, hemisphere particle layer 14 may be heat treated in an oxidizing atmosphere to form thermal oxide layer (not shown) on the surface thereof, before planarizing insulation layer 15, which may be an oxide layer, is formed thereon.

To compensate for possible surface defects of polysilicon layer 13 and hemisphere particle layer 14 occurring during the etching back thereof, another polysilicon layer (not shown) may be coated on layers 13 and 14. In this case, the thickness of the latter polysilicon layer should be limited to a predetermined range enabling the protruded shape of layers 13 and 14 to be maintained.

Figure 5A:
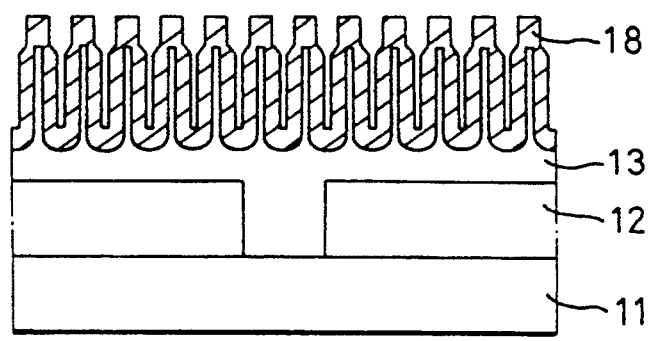
FIGS. 5a and 5b are schematic sectional views for explaining a method of compensating surface defects possibly occurring in the method illustrated in FIGS. 4a to 4d.
Figure 5B:
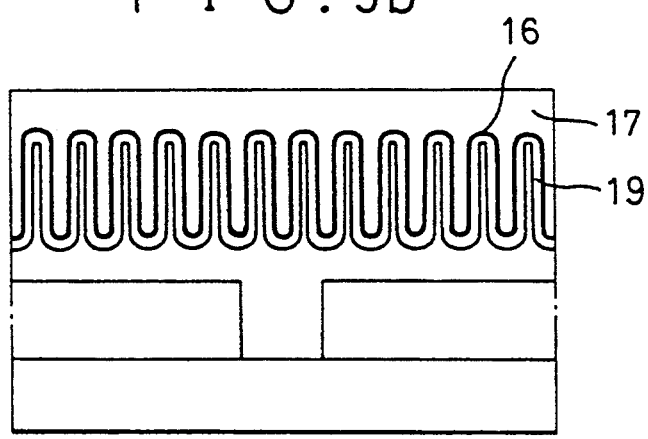

After performing the step shown in FIG. 4c, the following step may be additionally performed, so as to compensate for the above-mentioned possible surface defects of polysilicon layer 13 and hemisphere particle layer 14. That is, layers 13 and 14 are heat treated in an oxidizing atmosphere, so as to produce thermal oxide layer 18 surrounding protrusions of layers 13 and 14, as shown in FIG. 5a. At this time, protrusions of layers 13 and 14 become slender due to the production of thermal oxide layer 18. Thermal oxide layer 18 is then removed. Thereafter, the protrusions are coated with polysilicon layer 19 having a thickness enabling the shape of protrusions to be maintained, as shown in FIG. 5b. The steps of FIG. 4d are then performed. Alternatively, the steps of FIG. 4d may be performed without coating of a polysilicon layer such as polysilicon layer 19.

In order to facilitate the etching back step for forming the polysilicon layers to have a protruded shape, the etch ending point may be set by using a metal or a metal compound of a high melting point.

Setting of the etch ending point according to the present invention will now be described, in conjunction with FIGS. 6a to 6d. In the drawings, the same reference numerals as those in FIGS. 4a to 5b designate the same materials, respectively.

Figure 6A:
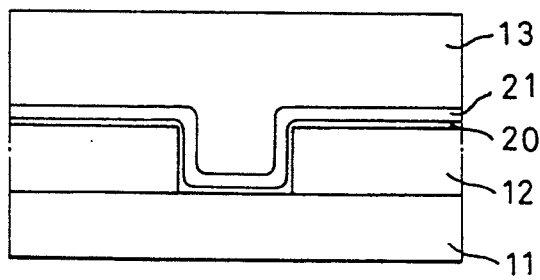
FIGS. 6a to 6d are schematic sectional views for explaining the method illustrated in FIGS. 4a to 4d in which an etch ending point is set, in accordance with the present invention.

Oxide layer 12 is first formed on semiconductor substrate 11 on which a transistor (not shown) has been previously formed. In oxide layer 12, capacitor node contacts are then formed. On the overall surface of oxide layer 12, glue layer 20 is coated which is of TiW, Ti/TiN or sputtered tungsten. On glue layer 20, etch stopper 21 is formed which is of a metal having a high melting point such as W, Mo, Mg, Cr, Ti, Co, Ni, Pd or Pt, or a metal compound having a high melting point such as $WSi_2$, $MoSi_2$, $MgSi_2$, $CrSi_2$, $TiSi_2$, $NiSi_2$, $PdSi_2$, or $PtSi_2$. Doped polysilicon layer 13 is then coated on etch stopper 21, as shown in FIG. 6a.

Figure 6B:
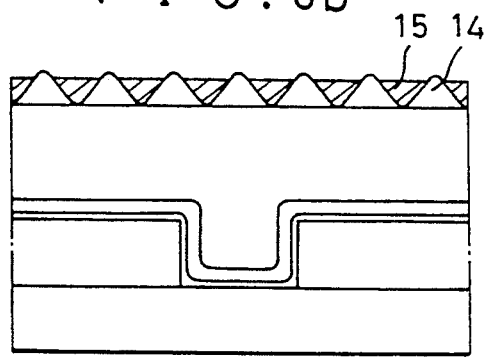

On polysilicon layer 13, hemisphere particle layer 14 of polysilicon is coated to have alternating hills and valleys, as shown in FIG. 6b. On hemisphere particle layer 14, planarizing insulation layer 15 of a material having an etching selectivity higher than that of polysilicon is coated. The material of planarizing insulation layer 15 may be SOG, polyamide, CVD oxide or CVD nitride. Layer 15 is then etched back such that the crest of each hill of hemisphere particle layer 14 is exposed. Accordingly, layer 15 partially remains only in valleys of hemisphere particle layer 14, as shown in FIG. 6b.

Figure 6C:
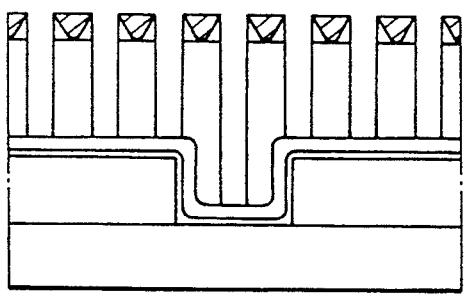

Thereafter, the exposed hill portions of hemisphere particle layer 14 are etched back by using the remaining portions of layer 15 as a pattern mask. Polysilicon layer 13 is subsequently etched through the etched portions of hemisphere particle layer 14, so as to expose partially etch stopper 21. As a result, polysilicon layer 13 has a plurality of protrusions-thereon, as shown in FIG. 6c.

Figure 6D:
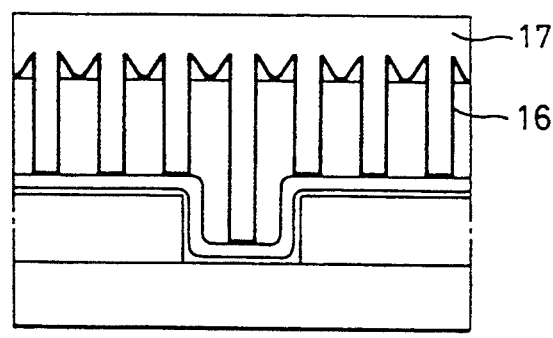

After the remaining portions of planarizing insulation layer 15 are removed, dielectric layer 16 and plate polysilicon layer 17 are coated in turn on the overall upper surface of polysilicon layer 13 to produce a capacitor, as shown in FIG. 6d.

Referring to FIGS. 7a to 7d, there is illustrated another method similar to that of FIGS. 6a to 6d. In the drawings, the same reference numerals as those in FIGS. 6a to 6d designate the same materials, respectively. FIGS. 7a to 7d explain the method illustrated in FIGS. 4a to 4d in which an etch ending point is set.

Figure 7A:
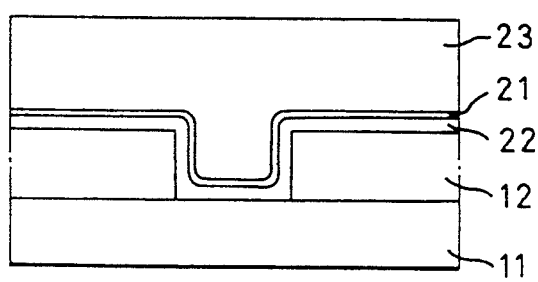
FIGS. 7a to 7d are schematic sectional views for explaining the method illustrated in FIGS. 4a to 4d in which an etch ending point is set, in accordance with the present invention.

Oxide layer 12 is first coated on semiconductor substrate 11 on which a transistor (not shown) has been previously formed. In oxide layer 12, capacitor node contacts are then formed. On the overall surface of oxide layer 12, doped polysilicon layer 22 is coated. On doped polysilicon layer 22, etch stopper 21 of a metal or a metal compound having a high melting point and another doped polysilicon layer 23 are coated in turn, as shown in FIG. 7a.

Figure 7B:
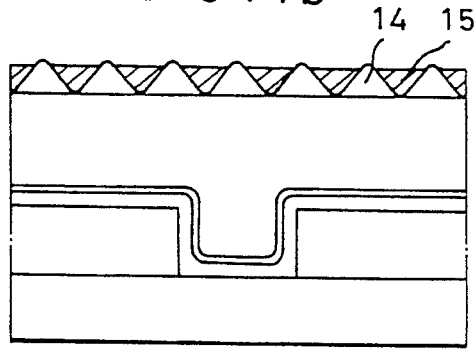

On polysilicon layer 23, hemisphere particle layer 14 is coated to have alternating hills and valleys, as shown in FIG. 6b. On hemisphere particle layer 14, planarizing insulation layer 15 is coated. Layer 15 is then etched back such that the crest of each hill of hemisphere particle layer 14 is exposed. Accordingly, layer 15 partially remains only in valleys of the hemisphere particle layer 14, as shown in FIG. 7b.

Figure 7C:
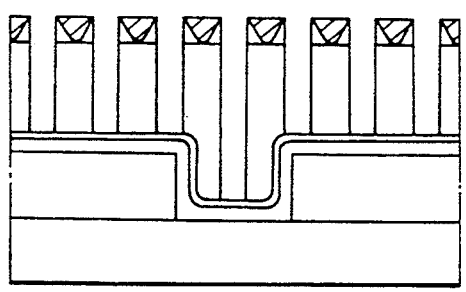

Thereafter, the exposed hill portions of hemisphere particle layer 14 are etched back by using the remaining portions of layer 15 as a pattern mask. Polysilicon layer 23 is subsequently etched through the etched portions of hemisphere particle layer 14, so as to expose etch stopper 21 partially. As a result, polysilicon layer 13 has a plurality of protrusions thereon, as shown in FIG. 7c.

Figure 7D:
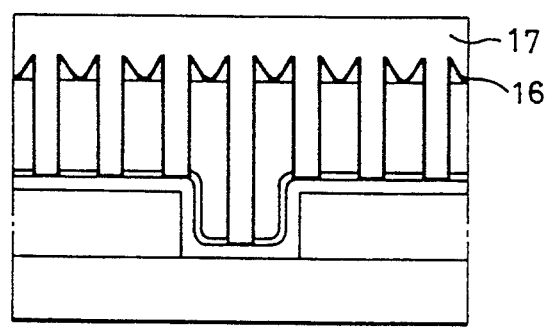

Dielectric layer 16 and plate polysilicon layer 17 are then coated in turn on the overall upper surface of polysilicon layer 13, under the condition that the exposed portions of etch stopper 21 have been removed, thereby producing a capacitor, as shown in FIG. 7d.

FIGS. 8a to 8e are schematic sectional views for explaining a method of manufacturing capacitors of semiconductor devices in accordance with the second embodiment of the present invention.

Figure 8A:
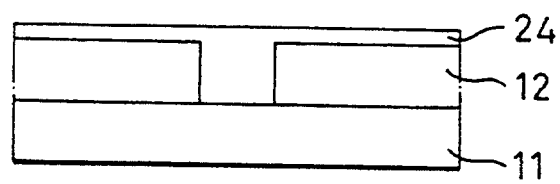
FIGS. 8a to 8e are schematic sectional views for explaining a method of manufacturing capacitors of semiconductor devices in accordance with the second embodiment of the present invention.
Figure 8B:
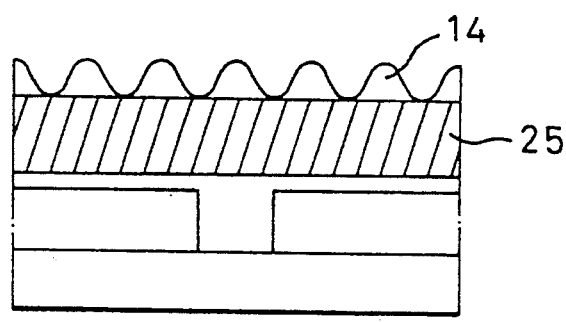

In this method, oxide layer 12 is first coated on semiconductor substrate 11 on which a transistor (not shown) has been previously formed. In oxide layer 12, capacitor node contacts are then formed. Thereafter, doped polysilicon layer 24 is coated on the overall surface of oxide layer 12 to form a plug, as shown in FIG. 8a. Insulation layer 25 such as an oxide layer is then coated on the overall surface of polysilicon layer 24. On insulation layer 25, hemisphere particle layer 14 of polysilicon is coated to have alternating hills and valleys, as shown in FIG. 8b.

The portions of insulation layer 25 disposed beneath the valley portions of hemisphere particle layer 14 are then etched back to expose partially polysilicon layer 24, by using the hill portions of hemisphere particle layer 14 as a pattern mask. As a result, insulation layer 25 has a plurality of protrusions thereon, as shown in FIG. 8c.

Thereafter, another doped polysilicon layer 26 is coated on insulation layer 25 to fill valleys thereof and cover the protrusions thereof. Polysilicon layer 26 is then etched back to expose the upper surface of insulation layer 25, as shown in FIG. 8d.

Insulation layer 25 is removed to expose the upper surface of polysilicon layer 24. Subsequently, dielectric layer 16 and plate polysilicon layer 17 are coated in turn on the overall upper surface of polysilicon layers 24 and 26 to produce a capacitor, as shown in FIG. 8e.

Figure 8C:
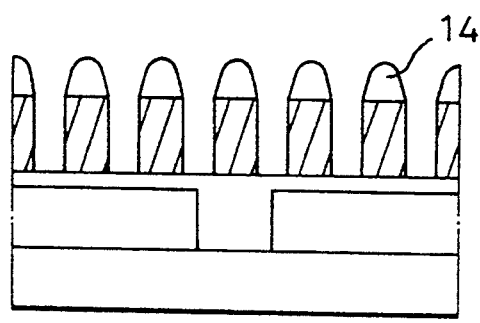
Figure 8D:
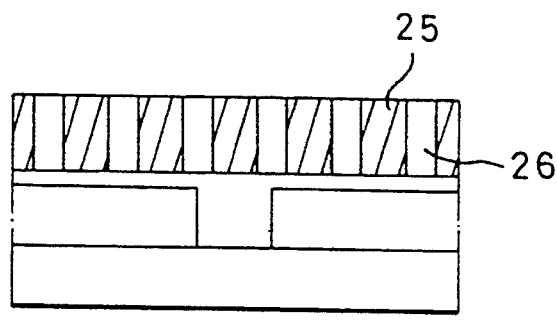
Figure 8E:
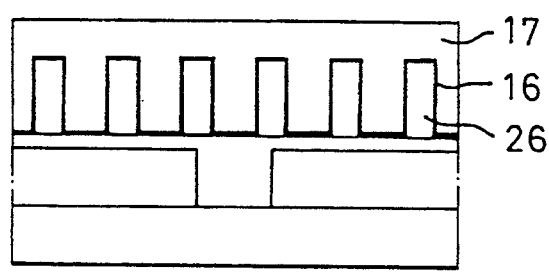

If the following process is carried out after the step shown in FIG. 8c, it is possible to obtain capacitors having still higher capacity. Now, this process will be described, in conjunction with FIGS. 9a to 9c.

Figure 9A:
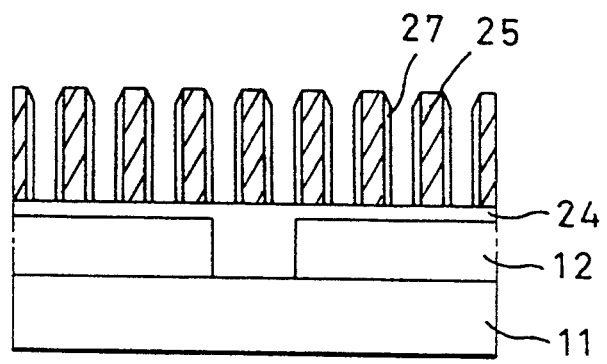
FIGS. 9a to 9c are schematic sectional views for explaining another method of manufacturing capacitors of semiconductor devices in accordance with the second embodiment of the present invention.
Figure 9B:
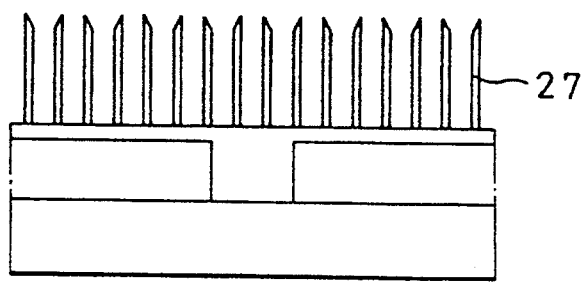
Figure 9C:
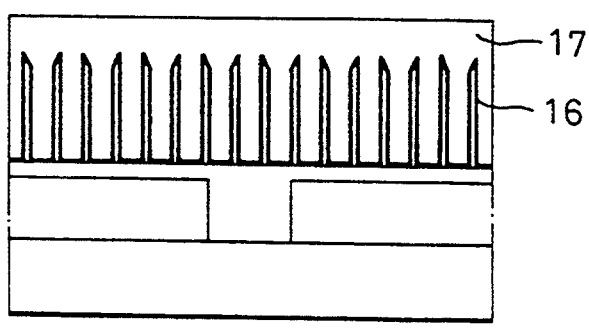

After performing the step of forming protruded insulation layer 25 as shown in FIG. 8c, doped polysilicon layer 27 is coated on insulation layer 25. Then, polysilicon layer 27 is anisotropically etched back to expose the upper surface of insulation layer 25 and remain, as side walls, at opposite side surfaces of each protrusion of insulation layer 25, as shown in FIG. 9a. Subsequently, insulation layer 25 is removed to expose polysilicon layer 24, as shown in FIG. 9b. Dielectric layer 16 and plate polysilicon layer 17 are then coated in turn on the overall upper surface of polysilicon layers 24 and 27 to produce a capacitor, as shown in FIG. 9c.

FIGS. 10a to 10e are schematic sectional views for explaining a method of manufacturing capacitors of semiconductor devices in accordance with the third embodiment of the present invention.

Figure 10A:
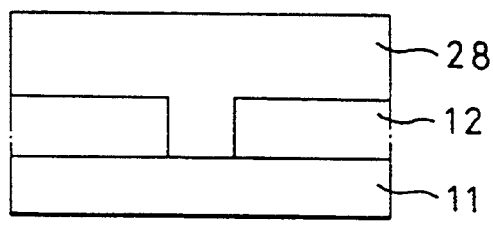
FIGS. 10a to 10e are schematic sectional views for explaining a method of manufacturing capacitors of semiconductor devices in accordance with the third embodiment of the present invention.
Figure 10B:
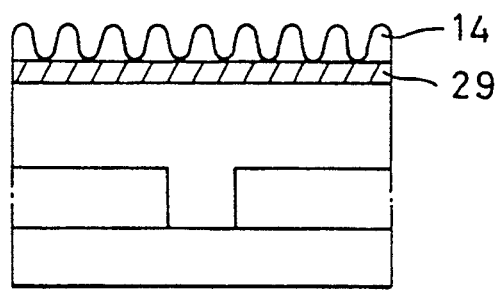
Figure 10C:
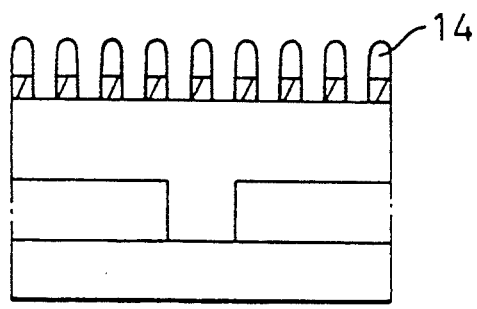

In this method, oxide layer 12 is first coated on semiconductor substrate 11 on which a transistor (not shown) has been previously formed. In oxide layer 12, capacitor node contacts are then formed. Thereafter, doped polysilicon layer 28 is coated on the overall surface of oxide layer 12, as shown in FIG. 10a. Insulation layer 29 such as an oxide layer is then coated on the overall surface of polysilicon layer 28. On insulation layer 29, hemisphere particle layer 14 of polysilicon is coated to have alternating hills and valleys, as shown in FIG. 10b.

Figure 10D:
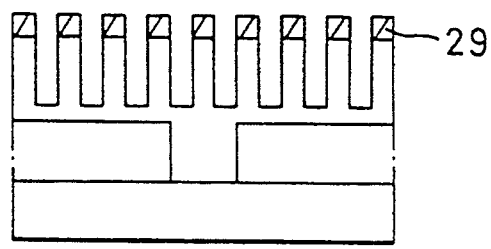

The portions of insulation layer 29 disposed beneath the valley portions of hemisphere particle layer 14 are then etched back to expose polysilicon layer 28 partially, by using the hill portions of hemisphere particle layer 14 as a pattern mask. Thereafter, the exposed portions of polysilicon layer 28 are etched back to a predetermined depth, by using the remaining portions of insulation layer 29 as a mask, as shown in FIG. 10d. As a result, polysilicon layer 28 has a plurality of protrusions thereon.

Figure 10E:
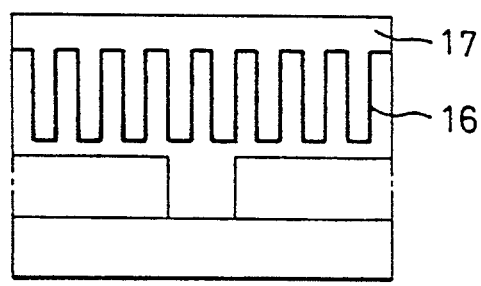

After remaining portions of insulation layer 29 are removed, dielectric layer 16 and plate polysilicon layer 17 are coated in turn on the overall upper surface of polysilicon layer 28 to produce a capacitor, as shown in FIG. 10e.

In manufacturing capacitors of semiconductor elements, the isolation between adjacent capacitors can be accomplished by performing a photo etching process after the formation of capacitors or using the following methods, in accordance with the present invention.

Referring to FIGS. 11a to 11f, there is illustrated an example of such a method.

Figure 11A:
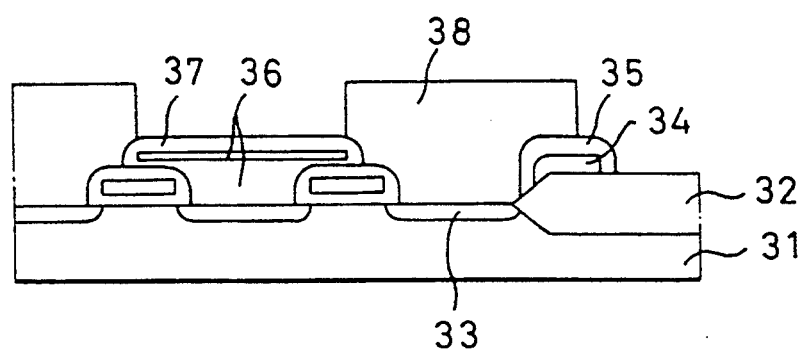
Figure 11B:
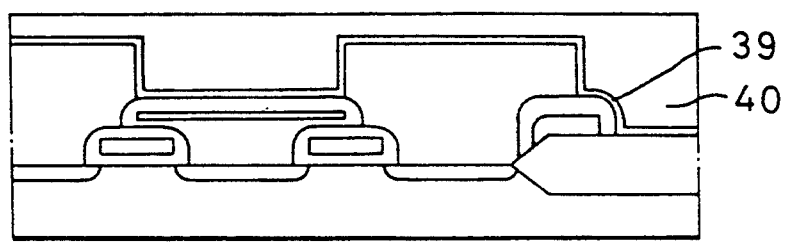
Figure 11C:
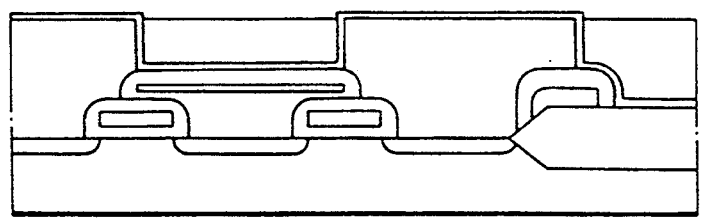

On a semiconductor device which has transistors, buried bit lines 36 and capacitor node contacts, a storage node polysilicon layer 38 is coated, in order to form a capacitor. Storage node polysilicon layer 38 is etched back to remain partially at capacitor zones, as shown in FIG. 11a. Then, nitride layer 39 is coated on the device. On nitride layer 39, oxide layer 40 is coated for providing a planar upper surface, as shown in FIG. 11b. Oxide layer 40 is then etched back to expose the portions of nitride layer 39 above storage node polysilicon layer 38, as shown in FIG. 11c.

The exposed portions of nitride layer 39 are subsequently removed to expose storage node polysilicon layer 38. Thereafter, hemisphere particle layer 41 of polysilicon is coated on the overall exposed surface to have alternating hills and valleys. The valleys of hemisphere particle layer 41 are then filled with insulation layer 42. At this time, the crest of each hill of hemisphere particle layer 41 is maintained to be exposed, as shown in FIG. 11d. Thereafter, the exposed hill portions of hemisphere particle layer 41 and storage node polysilicon layer 38 are etched back to a predetermined depth, by using insulation layer 42 filled in the valley portions of hemisphere particle layer 41 as a mask, as shown in FIG. 11e. At this time, oxide layer 40 disposed in the capacitor isolation zones functions as an etch stopper.

After the remaining portions of insulation layer 42, oxide layer 40 and nitride layer 39 are removed, dielectric layer 43 and plate polysilicon layer 44 are coated in turn on the overall upper surface to produce a capacitor, as shown in FIG. 11f.

In this case, the method also may be performed under the condition that the etch ending point has been set in storage node polysilicon layer 38, as illustrated in FIGS. 6a to 6d or FIGS. 7a to 7d.

In the drawings, the reference numeral "31" designates a semiconductor substrate, "32" a field oxide layer, "33" a source and drain, "34" a gate, "35" and "37" oxide layers, and "36" a bit line.

On the other hand, FIGS. 12a to 12e illustrates another method in accordance with the present invention.

On a semiconductor device which has the same construction as that in the above-mentioned first case, storage node polysilicon layer 38 is coated, in order to form a capacitor. Storage node polysilicon layer 38 is etched back to remain partially at capacitor zones, as in the first method. In place of nitride layer 39 in the first method, polysilicon layer 45 is coated on the device in this case. On polysilicon layer 45, oxide layer 40 is coated for providing a planar upper surface, as shown in FIG. 12a. Oxide layer 40 is then etched back to expose the portions of polysilicon layer 45 above storage node polysilicon layer 38, as shown in FIG. 12b.

Thereafter, hemisphere particle layer 41 of polysilicon is coated on the overall exposed surface, to have alternating hills and valleys. The valleys of hemisphere particle layer 41 are then filled with insulation layer 42. At this time, the crest of each hill of hemisphere particle layer 41 is maintained to be exposed, as shown in FIG. 12c. Thereafter, the exposed hill portions of hemisphere particle layer 41, polysilicon layer 45 and storage node polysilicon layer 38 are etched back to a predetermined depth, by using insulation layer 42 filled in the valley portions of hemisphere particle layer 41 as a mask, as shown in FIG. 12d. At this time, oxide layer 40 disposed in the capacitor isolation zones functions as an etch stopper.

After remaining portions of insulation layer 42 and oxide layer 40 are removed, polysilicon layer 45 is etched back to expose the portions of oxide layer 37 disposed in the capacitor isolation zones, without a mask. Dielectric layer 43 and plate polysilicon layer 44 are then coated in turn on the overall upper surface to produce a capacitor, as shown in FIG. 12e.

In this case, the method also may be performed under the condition that the etch ending point has been set in storage node polysilicon layer 38, as illustrated in FIGS. 6a to 6d or FIGS. 7a to 7d.

Referring to FIGS. 13a to 13e, there is illustrated a further method in accordance with the present invention.

Figure 13A:
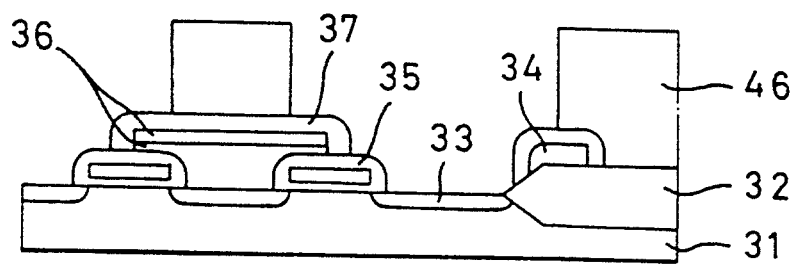
FIGS. 13a to 13e are schematic sectional views for explaining a further method of providing isolation between adjacent capacitors in manufacturing capacitors of semiconductor devices, in accordance with the present invention.
Figure 13B:
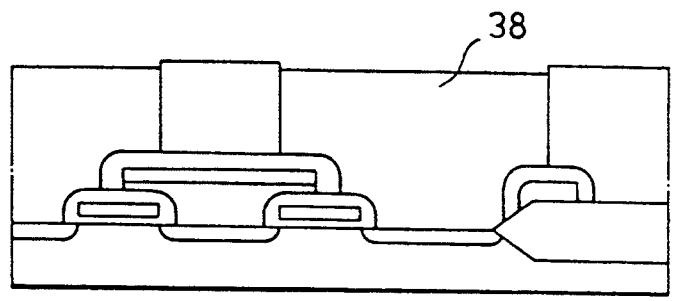

On a semiconductor device which has transistors and buried bit lines 36, nitride layer 46 is coated, which is then etched back to remain partially at capacitor isolation zones, as shown in FIG. 13a. Then, storage node polysilicon layer 38 is coated on the overall surface, for providing a planar upper surface. Storage node polysilicon layer 38 is then etched back to expose the portions of nitride layer 46 disposed at the capacitor isolation zones, as shown in FIG. 13b.

Figure 13C:
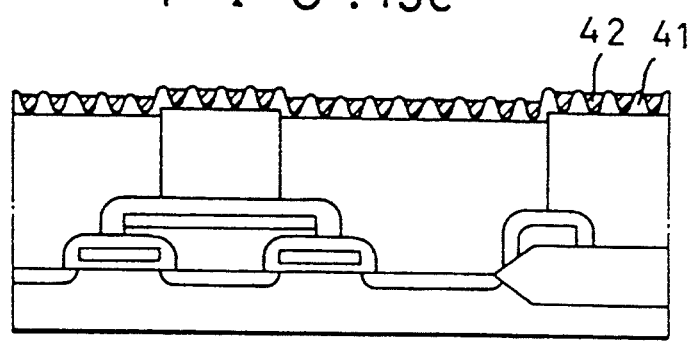
Figure 13D:
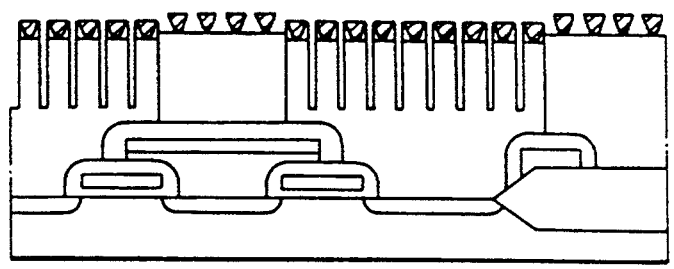

Thereafter, hemisphere particle layer 41 of polysilicon is coated on the overall exposed surface, to have alternating hills and valleys. The valleys of hemisphere particle layer 41 are then filled with insulation layer 42. At this time, the crest of each hill of hemisphere particle layer 41 is maintained to be exposed, as shown in FIG. 13c. Thereafter, the exposed hill portions of hemisphere particle layer 41 and storage node polysilicon layer 38 are etched back to a predetermined depth, by using insulation layer 42 filled in the valley portions of hemisphere particle layer 41 as a mask, as shown in FIG. 13d. At this time, nitride layer 46 disposed in the capacitor isolation zone functions as an etch stopper.

Figure 13E:
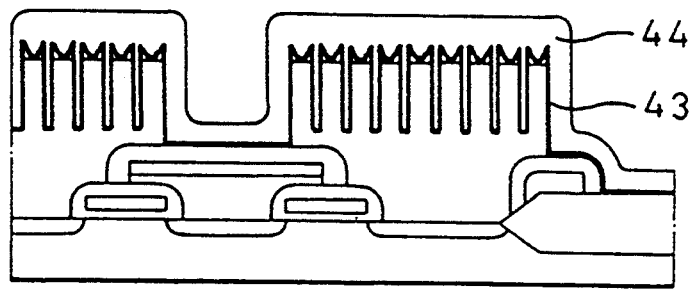

After remaining portions of insulation layer 42 and nitride layer 46 are removed, dielectric layer 43 and plate polysilicon layer 44 are coated in turn on the overall upper surface to produce a capacitor, as shown in FIG. 13e.

In this case, the method also may be performed under the condition that the etch ending point has been set in storage node polysilicon layer 38, as illustrated in FIGS. 6a to 6d or FIGS. 7a to 7d.

As is apparent from the above description, a pattern mask can be obtained by using a hemisphere particle layer having alternating hills and valleys or a layer filled in the valleys of hemisphere particle layer, in accordance with the present invention. As a result, it is possible to accomplish a hyperfine patterning of about 0.1 μm. Since the mean size and the density of hills and valleys of the hemisphere layer can be controlled, the pattern size also can be controlled.

Furthermore, where the present invention is applied to capacitors of semiconductor memory elements, the capacitor node surface area can be increased, depending on the etched back depth of polysilicon layer. The etched back range of polysilicon layer can be also controlled by an etch stopper, so that a sufficient capacitor node surface area can be provided. Consequently, it is possible to provide next generation super integrated semiconductor memory elements.

Although various preferred embodiments of the invention have been disclosed for illustrative purposes, those skilled in the art will appreciate that various modifications, additions and/or substitutions are possible without departing from the scope and spirit of the invention as disclosed in the accompanying claims. In particular, embodiments of the invention may be combined with one another.

What is claimed is:

1. A patterning method for a semiconductor device comprising the steps of:
   (1) forming a hemisphere polysilicon particle layer having hills and valleys on a first layer to be etched; and
   (2) etching portions of the first layer beneath the valleys of the hemisphere polysilicon particle layer, wherein the hills of the hemisphere polysilicon particle layer are used as a mask.

2. The patterning method of claim 1, wherein layer on the first layer for a controlled time, wherein the pitch between the hills and valleys of the hemisphere polysilicon particle layer is determined by the controlled time of coating.

3. The patterning method of claims 1 or 2, wherein step (a) further comprises the step of etching back the hemisphere polysilicon particle layer, wherein the pitch between the hills or valleys of the hemisphere polysilicon particle layer is controllably altered.

4. The patterning method of claim 1, wherein the hemisphere polysilicon particle layer has an etch selectivity higher than the etch selectivity of the first layer.

5. The patterning method of claim 1, wherein the hemisphere polysilicon particle layer is formed by a chemical vapor deposition process.

6. The patterning method of claim 1, wherein the polysilicon comprising the hemisphere polysilicon particle layer is formed with an LPCVD process using $SiH_4$ at a temperature of about 560° C. to about 600° C. and under a pressure of about 0.1 Torr to about 1.5 Torr, or is formed with an LPCVD process using $Si_2H_6$ at a temperature of about 570° C. to about 610° C. and under a pressure of about 0.1 Torr to about 1.5 Torr.

7. A patterning method for a semiconductor device comprising the steps of:
   (a) forming a first layer;
   (b) forming a second layer on the first layer;
   (c) forming a hemisphere polysilicon particle layer having hills and valleys on the second layer;
   (d) etching portions of the second layer beneath the valleys of the hemisphere polysilicon particle layer to expose portions of the first layer, wherein the hills of the hemisphere polysilicon particle layer are used as a mask; and
   (e) etching the exposed portions of the first layer.

8. The patterning method of claim 7, wherein step (c) comprises coating the hemisphere polysilicon particle layer on the first layer for a controlled time, wherein the pitch between the hills and valleys of the hemisphere polysilicon particle layer is determined by the controlled time of coating.

9. The patterning method of claims 7 or 8, wherein step (c) further comprises the step of etching back the hemisphere polysilicon particle layer, wherein the pitch between the hills or valleys of the hemisphere polysilicon particle layer is controllably altered.

10. The patterning method of claim 7, wherein the second layer has an etch selectivity higher than the etch selectivity of the first layer, and wherein the hemisphere polysilicon particle layer has an etch selectivity higher than the etch selectivity of the second layer.

11. The patterning method of claim 7, wherein the hemisphere polysilicon particle layer is formed by a chemical vapor deposition process.

12. The patterning method of claim 7, wherein the polysilicon comprising the hemisphere polysilicon particle layer is formed with an LPCVD process using $SiH_4$ at a temperature of about 560° C. to about 600° C. and under a pressure of about 0.1 Torr to about 1.5 Torr, or is formed with an LPCVD process using $Si_2H_6$ at a temperature of about 570° C. to about 610° C. and under a pressure of about 0.1 Torr to about 1.5 Torr.

13. A method of manufacturing a capacitor on a semiconductor substrate, wherein the capacitor has a plurality of protrusions, comprising the steps of:
   (a) forming a capacitor node contact on the semiconductor substrate, forming a first polysilicon layer over the capacitor node contact;
   (b) forming an insulation layer on the first polysilicon layer and forming a hemisphere particle layer having hills and valleys on the insulation layer;
   (c) etching portions of the insulation layer beneath the valleys of the hemisphere particle layer to expose portions of the first polysilicon layer, wherein the hills of the hemisphere particle layer are used as a mask, wherein the insulation layer has a plurality of protrusions formed therein having upper portions;
   (d) filling the etched portions of the second insulation layer with a second polysilicon layer, wherein the upper portions of the protrusions of the second insulation are exposed; and
   (e) removing the insulation layer, wherein a plurality of protrusions of the second polysilicon layer are formed, and forming a dielectric layer and plate polysilicon layer on the plurality of protrusions of the second polysilicon layer.

14. A method of manufacturing a capacitor on a semiconductor substrate, wherein the capacitor has a plurality of protrusions, comprising the steps of:
   (a) forming a capacitor node contact on the semiconductor substrate, forming a node polysilicon layer over the capacitor node contact;
   (b) forming an insulation layer on the storage node polysilicon layer, and forming a hemisphere particle layer having hills and valleys on the insulation layer;
   (c) etching the portions of the insulation layer beneath the valleys of the hemisphere particle layer to expose portions of the node polysilicon layer, wherein the hills of the hemisphere particle layer are used as a mask, wherein the insulation layer has a plurality of protrusions formed therein having upper portions and side surface portions;
   (d) forming a storage polysilicon layer on the overall surface, and anisotropically etching the storage polysilicon layer to expose the upper portions of the protrusions of the insulation layer, wherein portions of the storage polysilicon layer remain as side walls on the side surfaces of the protrusions of the insulation layer; and
   (e) removing the insulation layer, wherein protrusions of the storage polysilicon layer are formed on the node polysilicon layer, forming a dielectric layer and plate polysilicon layer on the protrusions of the storage polysilicon layer and the node polysilicon layer.

15. A method of manufacturing a capacitor on a semiconductor substrate, wherein the capacitor has a plurality of protrusions, comprising the steps of:
   (a) forming a capacitor node contact on the semiconductor substrate, and forming a storage node polysilicon layer over the capacitor node contact;
   (b) forming an insulation layer on the storage node polysilicon layer, and forming a hemisphere particle layer having hills and valleys on the insulation layer;
   (c) etching the portions of the insulation layer beneath the valleys of the hemisphere particle layer to expose the storage node polysilicon layer, wherein the hills of the hemisphere particle layer are used as a mask, wherein a plurality of protrusions of the insulation layer is formed;
   (d) etching the exposed portions of the storage node polysilicon layer to a predetermined depth, wherein the protrusions of the insulation layer are used as a mask; and
   (e) removing the insulation layer and forming a dielectric layer and plate polysilicon layer on the storage node polysilicon layer.

* * * * *